United States Patent
Sekiya et al.

(10) Patent No.: US 7,986,088 B2
(45) Date of Patent: Jul. 26, 2011

(54) FLUORESCENCE CONVERSION MEDIUM AND COLOR LIGHT-EMITTING DEVICE INCLUDING THE SAME

(75) Inventors: Takashi Sekiya, Sodegaura (JP); Jiro Yamada, Tokyo (JP)

(73) Assignees: Idemitsu Kosan Co., Ltd., Tokyo (JP); Sony Corporation, Tokyo (JP)

( * ) Notice: Subject to any disclaimer, the term of this patent is extended or adjusted under 35 U.S.C. 154(b) by 948 days.

(21) Appl. No.: 11/685,896

(22) Filed: Mar. 14, 2007

(65) Prior Publication Data

US 2008/0029710 A1 Feb. 7, 2008

(30) Foreign Application Priority Data

Aug. 3, 2006 (JP) .................. 2006-212166

(51) Int. Cl.
*C09K 11/08* (2006.01)
*H05B 33/12* (2006.01)
*H01L 51/50* (2006.01)

(52) U.S. Cl. ......... 313/501; 313/502; 313/503; 313/504
(58) Field of Classification Search ........... 313/501–504
See application file for complete search history.

(56) References Cited

U.S. PATENT DOCUMENTS

| | | | |
|---|---|---|---|
| 6,501,091 B1 | 12/2002 | Bawendi et al. | |
| 6,608,439 B1 | 8/2003 | Sokolik et al. | |
| 2004/0105481 A1 | 6/2004 | Ishida et al. | |
| 2004/0135495 A1 | 7/2004 | Wu et al. | |
| 2006/0158103 A1* | 7/2006 | Katano et al. | 313/504 |
| 2007/0164661 A1* | 7/2007 | Kuma | 313/501 |
| 2008/0252198 A1 | 10/2008 | Katano et al. | |

FOREIGN PATENT DOCUMENTS

| | | |
|---|---|---|
| EP | 1 868 419 A1 | 12/2007 |
| JP | 3-152897 | 6/1991 |
| JP | 8-286033 | 11/1996 |
| JP | 2004-083653 | 3/2004 |
| JP | 2006-503418 | 1/2006 |
| WO | WO 2005/097939 A1 | 10/2005 |
| WO | WO 2006008987 A1 * | 1/2006 |

OTHER PUBLICATIONS

Extended European Search Report issued Feb. 9, 2011, in Patent Application No. 07738068.1.

* cited by examiner

*Primary Examiner* — Nimeshkumar D Patel
*Assistant Examiner* — Anthony T Perry
(74) *Attorney, Agent, or Firm* — Oblon, Spivak, McClelland, Maier & Neustadt, L.L.P.

(57) ABSTRACT

A fluorescence conversion medium comprising, a fluorescent fine particle formed of an inorganic nanocrystal which absorbs visible and/or near ultraviolet light and emits visible fluorescence, and a transparent medium which disperses the fluorescent fine particle therein, an absorbance at a wavelength where the fluorescent intensity is maximized being in the range of 0.1 to 1.

11 Claims, 6 Drawing Sheets

FLUORESCENCE CONVERSION MEDIUM AND COLOR LIGHT-EMITTING DEVICE INCLUDING THE SAME

TECHNICAL FIELD

The invention relates to a fluorescence conversion medium and a color light-emitting apparatus (color emitting apparatus) including the same. In particular, the invention relates to a highly efficient fluorescence conversion medium in which an inorganic nanocrystal is dispersed, and a color emitting apparatus obtained by combining the fluorescence conversion medium and a light source part which emits visible and/or near ultraviolet light.

BACKGROUND ART

A fluorescence conversion substrate which converts the wavelength of light emitted from a light source part using a fluorescent material has been applied in various fields such as the electronic display field.

For example, an organic electroluminescent device ("electroluminescent" may be hereinafter referred to as "EL") has been disclosed which has an organic electroluminescent material part which emits light of blue or bluish green and a fluorescent material part which absorbs light emitted from the emitting layer and emits visible fluorescence of at least one color from bluish green to red (see Patent Document 1, for example).

This method utilizes a blue light source and converts the color of light using a color conversion medium to obtain the three primary colors. Specifically, a fluorescent dye in the color conversion medium is excited by irradiation of blue light, whereby green or red light having a longer wavelength is generated.

Organic fluorescent dyes and organic fluorescent pigments have been generally used as the fluorescent materials for the fluorescence conversion medium. For example, a red color conversion medium has been disclosed which is obtained by dispersing a rhodamine fluorescent pigment and a fluorescent pigment having an absorption in the blue region and inducing energy transfer or reabsorption in the rhodamine fluorescent pigment in a light-transmitting medium (see Patent Document 2, for example).

To enhance the fluorescence conversion efficiency as well as to increase the intensity of the converted light (fluorescent intensity), it is required to allow light emitted from a light source to be absorbed sufficiently in the fluorescence conversion medium. However, if the concentration of organic fluorescent dyes in the fluorescence conversion medium is increased, the organic fluorescent dyes may contact each other inside the film. As a result, energy absorbed from the light source is transferred to adjacent dyes (concentration quenching) so that a fluorescent quantum efficiency cannot be obtained.

When a reactive resin such as a photo-curable resin or a heat-curable resin is used as a light-transmitting medium, a reactive component in the resin and an organic fluorescent dye are reacted to decompose or undergo a structural change. Therefore, there was a problem that the fluorescent intensity of a fluorescence conversion medium is lowered when an ultraviolet light is irradiated or when baking is performed at a high temperature, for example, at 200° C., during the process of forming a fluorescence conversion medium. When an emitting apparatus is driven continuously, a fluorescence conversion medium is continuously irradiated with exited light, resulting in lowering of the fluorescent intensity of a fluorescence conversion medium with the lapse of time.

To solve the above-mentioned problems, specifically, to solve the problems caused by the use of an organic fluorescent dye as a fluorescent material used in a fluorescence conversion medium, Patent Document 3 proposes a technique of fabricating a full-color organic electroluminescence (EL) device utilizing an inorganic nanocrystal. According to this technique, a film obtained by dispersing CdS, CdSe, or CdTe as a nanocrystal in a light-transmitting resin is used as a fluorescence conversion medium, and the fluorescence conversion medium is connected to an organic EL device emitting a blue monochromatic color with a peak wavelength of 450 nm, whereby emission of red light and green light is achieved. The colors obtained by conversion such as red and green are controlled by adjusting the particle size of the inorganic nanocrystal.

Patent Document 4 discloses a technique of combining a fluorescence conversion medium in which an inorganic nanocrystal is dispersed with an LED to realize a highly efficient white LED.

In principle, a fluorescent fine particle formed of an inorganic nanocrystal has a large absorption in the emission band. Therefore, even though an attempt is made to increase the concentration of fluorescent fine particles to enhance conversion efficiency, improvement of the conversion efficiency is limited due to self absorption. As a result, the conversion efficiency is not improved to a degree which can be expected from the fluorescent quantum efficiency of a nanocrystal.

Patent Document 5 discloses a color emitting apparatus obtained by combining an organic EL light source and a fluorescence conversion medium obtained by dispersing an inorganic nanocrystal, which realizes high fluorescence conversion efficiency and high durability. However, loss of emitting components due to self absorption cannot be avoided, and therefore, fluorescence conversion efficiency was not sufficient.

| [Patent document 1] | JP-A-H3-152897 |
| [Patent document 2] | JP-A-H8-286033 |
| [Patent document 3] | U.S. Pat. No. 6,608,439 |
| [Patent document 4] | U.S. Pat. No. 6,501,091 |
| [Patent document 5] | WO2005/097939 |

The invention has been made in view of the aforementioned problems. An object of the invention is to provide a fluorescence conversion medium which exhibits high fluorescence conversion efficiency, as well as to provide a color emitting apparatus utilizing the same.

SUMMARY OF INVENTION

According to the invention, the following fluorescence conversion medium and a color emitting apparatus are provided.

1. A fluorescence conversion medium comprising, a fluorescent fine particle formed of an inorganic nanocrystal which absorbs visible and/or near ultraviolet light and emits visible fluorescence, and a transparent medium which disperses the fluorescent fine particle therein, an absorbance at a wavelength where the fluorescent intensity is maximized being in the range of 0.1 to 1.

2. A fluorescence conversion medium comprising,
a fluorescent fine particle formed of an inorganic nanocrystal which absorbs visible and/or near ultraviolet light and emits visible fluorescence, and
a transparent medium which disperses the fluorescent fine particles therein,
an overlapping value (P) represented by the following formula being $2.5 \leq P \leq 30$:

$$P=\int A(\lambda)\cdot I(\lambda)d\lambda$$

wherein $I(\lambda)$ (unit: $nm^{-1}$) indicates the emission intensity spectrum of the fluorescence conversion medium standardized to have a maximum value of 1 and $A(\lambda)$ (unit: infinite) indicates an absorbance spectrum of the fluorescence conversion medium, providing that the wavelength of light is $\lambda$ (unit: nm).

3. The fluorescence conversion medium according to 1 or 2, wherein the inorganic nanocrystal is a semiconductor nanocrystal.

4. The fluorescence conversion medium according to 3, wherein a bulk material used for the semiconductor nanocrystal has a band gap at 20° C. of 1.0 to 3.0 eV.

5. The fluorescence conversion medium according to 3 or 4, wherein the semiconductor nanocrystal has a structure in which a core formed of a semiconductor material is covered with at least one shell layer formed of a semiconductor material.

6. The fluorescence conversion medium according to one of 1 to 5, wherein the transparent medium is a resin and the surface of the inorganic nanocrystal is subjected to a compatibilizing treatment to have an increased affinity with the resin.

7. A color emitting apparatus comprising,
a light source part which emits visible and/or near ultraviolet light, and
a color conversion part which absorbs and/or transmits light from the light source part and emits light having a spectrum differing from a spectrum of the light from the light source part,
the color conversion part containing the fluorescence conversion medium according to one of 1 to 6.

8. The color emitting apparatus according to 7, wherein the color conversion part is a stacked body comprising the fluorescence conversion medium and a color filter which transmits fluorescence emitted by the fluorescence conversion medium and/or, of light transmitting the fluorescence conversion medium, light in a specific wavelength region, and blocks light components in the other wavelength regions.

9. The color emitting apparatus according to 7 or 8, wherein the light source part emits light containing at least blue light, and the color conversion part receives light from the light source part to emit at least one of red, green, and blue lights.

10. A color emitting apparatus comprising,
a light source part which emits light containing at least blue light,
a blue conversion part which receives light from the light source and emits blue light,
a green conversion part which receives light from a light source part and emits green light, and
a red conversion part which receives light from the light source part and emits red light,
the blue conversion part not containing fluorescence conversion medium and containing a blue color filter which transmits light in a blue wavelength region and blocks light components in the other wavelength regions,
at least one of the green conversion part and the red conversion part being a stacked body of the fluorescence conversion medium according to one of 1 to 6 and a color filter which transmits fluorescence conversion medium and/or, of light transmitting the fluorescence conversion medium, light in the green or red wavelength region and blocks light components in the other wavelength regions.

11. The color emitting apparatus according to 9 or 10, wherein the overlapping value (P) represented by the following formula of the green fluorescence conversion medium is $4 \leq P \leq 30$:

$$P=\int A(\lambda)\cdot I(\lambda)d\lambda$$

wherein $I(\lambda)$ (unit: $nm^{-1}$) indicates an emission spectrum of the fluorescence conversion medium which is standardized to have a maximum value of 1 and $A(\lambda)$ (unit: infinite) indicates an absorbance spectrum of the fluorescence conversion medium, providing that the wavelength of light is $\lambda$ (unit: nm).

12. The color emitting apparatus according to one of 9 to 11, wherein the overlapping value (P) represented by the following formula of the red fluorescence conversion medium is $2.5 \leq P \leq 20$:

$$P=\int A(\lambda)\cdot I(\lambda)d\lambda$$

wherein $I(\lambda)$ (unit: $nm^{-1}$) indicates an emission intensity spectrum of the fluorescence conversion medium which is standardized to have a maximum value of 1 and $A(\lambda)$ (unit: infinite) indicates an absorbance spectrum of the fluorescence conversion medium, providing that the wavelength of light is $\lambda$ (unit: nm).

13. The color emitting apparatus according to one of 7 to 12, wherein the light source part is an organic electroluminescence device.

14. The color emitting apparatus according to 13, wherein the organic electroluminescence device comprises a first light reflective electrode, a second light transmissible electrode, and an organic luminescent medium containing an organic emitting layer formed between the first electrode and the second electrode.

The invention provides a fluorescence conversion medium which exhibits high fluorescence conversion efficiency and undergoes a slight degree of deterioration with the lapse of time, and a color emitting apparatus using the same.

BEST MODE FOR CARRYING OUT THE INVENTION

The fluorescence conversion medium and the color emitting apparatus of the invention are described below with reference to the drawings.

Figure 1:
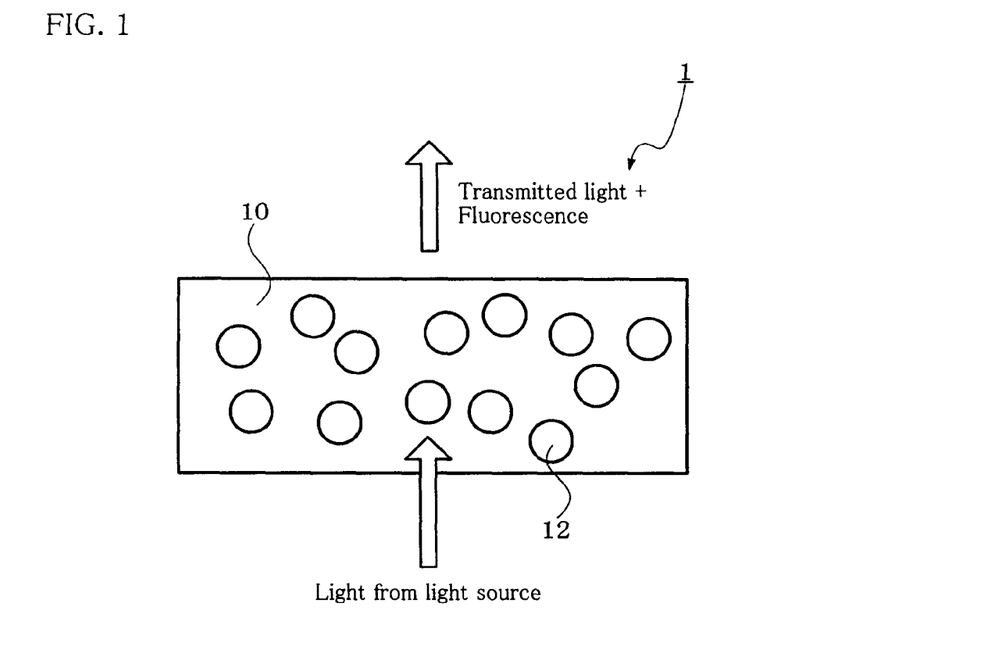
FIG. 1 is a schematic cross-sectional view showing one embodiment of the fluorescence conversion medium according to the invention.

FIG. 1 is a schematic cross-sectional view showing one embodiment of the fluorescence conversion medium according to the invention.

A fluorescence conversion medium 1 is a film obtained by dispersing fluorescent fine particles 12 in a transparent medium 10. The fluorescent fine particles 12 absorb light from a light source (not shown) and emit visible fluorescence.

Light converted by the fluorescence conversion medium 1 (visible fluorescence) and light from the light source and transmits the film without being converted exits the fluorescence conversion medium 1 to be released outside.

Structures of a fluorescence conversion medium are described below.

1. Fluorescence Conversion Medium (1) Fluorescent Fine Particles

The fluorescent fine particles used in the invention are formed of an inorganic nanocrystal obtained by finely dividing an inorganic crystal to have a particle diameter in the order of nanometers. As the inorganic nanocrystal, an inorganic nanocrystal which absorbs visible and/or near ultraviolet light and emits visible fluorescence is used. For a higher transparency and a reduced scattering loss, it is preferable to use an ultrafine inorganic nanocrystal with a particle diameter of 20 nm or less, and more preferably 10 nm or less.

When the transparent medium described later is formed of a resin, the surface of the inorganic nanocrystal is preferably treated to be compatible with the resin to improve the dispersibility of the inorganic nanocrystal in the resin. As examples of the compatibilizing treatment, a method of modifying or coating the surface of the nanocrystal with a long-chain alkyl group, phosphoric acid, a resin, or the like can be given.

Specific examples of a nanocrystal used in the invention are as follows.

(a) Fluorescent Nanocrystal Obtained by Doping Metal Oxide With Transition Metal ion Fluorescent nanocrystal obtained by doping a metal oxide such as $Y_2O_3$, $Gd_2O_3$, ZnO, $Y_3Al_5O_{12}$, or $Zn_2SiO_4$ with a transition metal ion which absorbs visible light, such as $Eu^{2+}$, $Eu^{3+}$, $Ce^{3+}$, of $Tb^{3+}$.

(b) Fluorescent Nanocrystal Obtained by Doping Metal Chalcogenide With Transition Metal ion Fluorescent nanocrystals obtained by doping a transition metal ion which absorbs visible light such as $Eu^{2+}$, $Eu^{3+}$, $Ce^{3+}$, or $Tb^{3+}$ to a metal chalcogenide such as ZnS, CdS, or CdSe can be given. The surface of the particle may be modified with a metal oxide such as silica, an organic substance, or the like in order to prevent removal of S, Se, or the like due to reaction components of the matrix resin described later.

(c) Fluorescent Nanocrystal Absorbs Visible Light and Emits Light Utilizing Band Gap of Semiconductor (Semiconductor Nanocrystal)

As materials of the semiconductor nanocrystal, crystals formed of group IV element compounds (group of the periodic table (long period)), group IIa element-group VIb element compounds, group IIIa element-group Vb element compounds and group IIIb element-group Vb element compounds, and chalcopyrite type compounds can be given.

Specific examples thereof include crystals of Si, Ge, MgS, MgSe, ZnS, Zns, ZnSe, ZnTe, AlP, AlAs, AlSb, GaP, GaAs, GaSb, CdS, CdSe, CdTe, InP, InAs, InSb, $AgAlS_2$, $AgAlSe_2$, $AgAlTe_2$, $AgGaS_2$, $AgGaSe_2$, $AgGaTe_2$, $AgInS_2$, $AgInSe_2$, $AgInTe_2$, $ZnSiP_2$, $ZnSiAs_2$, $ZnGeP_2$, $ZnGeAs_2$, $ZnSnP_2$, $ZnSnAs_2$, $ZnSnSb_2$, $CdSiP_2$, $CdSiAs_2$, $CdGeP_2$, $CdGeAs_2$, $CdSnP_2$, $CdSnAs_2$, and mixed crystals of these elements or compounds.

Of these, Si, AlP, AlAs, AlSb, GaP, GaAs, InP, ZnSe, ZnTe, CdS, CdSe, CdTe, $CuGaSe_2$, $CuGaTe_2$, $CuInS_2$, $CuInSe_2$ and $CuInTe_2$ are preferable. In particular, ZnSe, ZnTe, GaAs, CdS, CdTe, InP, $CuInS_2$ and $CuInSe_2$ (direct transition semiconductors) are still more preferable from the viewpoint of high luminous efficiency.

A semiconductor nanocrystal is preferably used because an emission wavelength can be easily controlled by its particle size, it exhibits a large absorption in the blue wavelength region and near ultraviolet wavelength region, and overlap of absorption and emission is large in an emitting region.

The functions of the semiconductor nanocrystals are described below.

The semiconductor material has a band gap of 0.5 to 4.0 eV at room temperature in the state of a bulk material ("bulk material" means a material which is not formed into particles), as disclosed in JP-T-2002-510866. When forming particles using the above material and reducing the diameter of the particles to a nanometer level, electrons in the semiconductor are confined in the nanocrystal. As a result, the nanocrystal exhibits a larger band gap.

In theory, the band gap increases in inverse proportion to the square of the diameter of the semiconductor particle. Therefore, the band gap can be controlled by controlling the diameter of the semiconductor particle. This semiconductor absorbs light having a wavelength shorter than the wavelength corresponding to the band gap, and emits fluorescence having a wavelength corresponding to the band gap.

The band gap of a bulk semiconductor is preferably 1.0 to 3.0 eV at 20° C. If the band gap is less than 1.0 eV, the resulting nanocrystal exhibits a fluorescence wavelength which changes to a large extent due to a change in the particle diameter, whereby the production management becomes difficult. If the band gap exceeds 3.0 eV, since the resulting nanocrystal emits only fluorescence having a wavelength shorter than that in the near ultraviolet region, it is difficult to use such a material for a color emitting apparatus.

The semiconductor nanocrystals may be produced using a known method such as that disclosed in U.S. Pat. No. 6,501,091. U.S. Pat. No. 6,501,091 discloses a production example in which a precursor solution prepared by mixing trioctyl phosphine (TOP) with trioctyl phosphine selenide and dimethylcadmium is added to trioctyl phosphine oxide (TOPO) heated at 350° C.

The semiconductor nanocrystal mentioned above is preferably a core/shell semiconductor nanocrystal comprising a core particle made of a semiconductor nanocrystal and at least one shell layer made of a semiconductor material having a larger band gap than the band gap of the semiconductor material used for the core particle. For example, the core/shell semiconductor nanocrystal has a structure in which the surface of a core particle formed of CdSe (band gap: 1.74 eV) is coated with a shell formed of a semiconductor material having a large band gap such as ZnS (band gap: 3.8 eV). This ensures that confinement effects for electrons produced in the core particle are easily obtained. In the above specific examples of the semiconductor nanocrystal, a phenomenon tends to occur in which S, Se, or the like is removed by an active component (e.g. unreacted monomer or water) in the transparent medium (described later) to damage the crystal structure of the nanocrystal, whereby the fluorescent properties disappear. In order to prevent this phenomenon, the surface of the semiconductor nanocrystal may be modified with a metal oxide such as silica, an organic substance, or the like.

The semiconductor nanocrystals may be produced using a known method such as that disclosed in U.S. Pat. No. 6,501,091. For example, a CdSe core/ZnS shell structure may be produced by adding a precursor solution prepared by mixing TOP with diethylzinc and trimethylsilyl sulfide to a TOPO solution heated at 140° C. in which CdSe core particles are dispersed.

The so-called Type II nanocrystal in which a carrier forming an exciton is separated between the core and the shell (J. Am. Chem. Soc., Vol. 125, No. 38, 2003, p 11466-11467) may also be used.

A nanocrystal with a multishell structure in which two or more layers are formed on the core to improve the stability, luminance efficiency, and emission wavelength (Angewandte Chemie, Vol. 115, 2003, pages 5189 to 5193) or the like may also be used.

The above fluorescent particles may be used either individually or in combination of two or more.

(2) Transparent Medium

The transparent medium is a medium in which the inorganic nanocrystals are dispersed and held. As the transparent medium, a transparent material such as glass or a transparent resin may be used. In particular, a resin such as a non-curable resin, heat-curable resin, or photo-curable resin is suitably used from the viewpoint of processability of the fluorescence conversion medium.

As specific examples of such a resin, in the form of either an oligomer or a polymer, a melamine resin, a phenol resin, an alkyd resin, an epoxy resin, a polyurethane resin, a maleic resin, a polyamide-based resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be given.

A photo-curable resin may be used in order to pattern the fluorescence conversion medium. As the photo-curable resin, a photo-polymerizable resin such as an acrylic acid or methacrylic acid-based resin containing a reactive vinyl group, a photo-crosslinkable resin such as polyvinyl cinnamate, or the like, which resins generally contain a photo-sensitizer, may be used. A heat-curable resin may be used when the photo-sensitizer is not used.

When forming a full color display, a fluorescence conversion medium is formed in which fluorescent material layers are separately disposed in a matrix. Therefore, a photo-curable resin which allows application of photolithography is preferably used as the matrix resin (transparent medium).

These matrix resins may be used individually or in combination of two or more.

When a photo-sensitizer is not included, an emission pattern can be formed by printing such as screen printing.

(3) Production of Fluorescence Conversion Medium

The fluorescence conversion medium is formed using a liquid dispersion prepared by mixing and dispersing the fluorescent particles and the matrix resin (transparent medium) using a known method such as milling or ultrasonic dispersion. In this case, a good solvent for the matrix resin may be used. A film is formed on a supporting substrate using the resulting fluorescent particle liquid dispersion by a known film formation method such as spin coating or screen printing to produce a fluorescence conversion medium.

Note that a UV absorber, dispersant, leveling agent, and the like may be added to the fluorescence conversion medium in addition to the fluorescent particles and the transparent medium insofar as the object of the invention is not impaired.

The fluorescence conversion medium of the invention is appropriately selected such that an absorbance at a wavelength where the fluorescent intensity is maximized becomes in the range of 0.1 to 1.

$I(\lambda)$ (unit: $nm^{-1}$) is defined as the emission intensity spectrum of the fluorescence conversion medium which is standardized such that the maximum value thereof is 1, providing that the wavelength of light is $\lambda$ (unit: nm). When $A(\lambda)$ (unit: infinite) is defined as the absorption spectrum of the fluorescence conversion medium, the overlapping value (P) is defined as $P=\int A(\lambda) \cdot I(\lambda) d\lambda$. The fluorescence conversion medium of the invention is appropriately selected such that the overlapping value (P) becomes $2.5 \leq P \leq 30$.

The reason therefor is explained in detail below.

Figure 2:
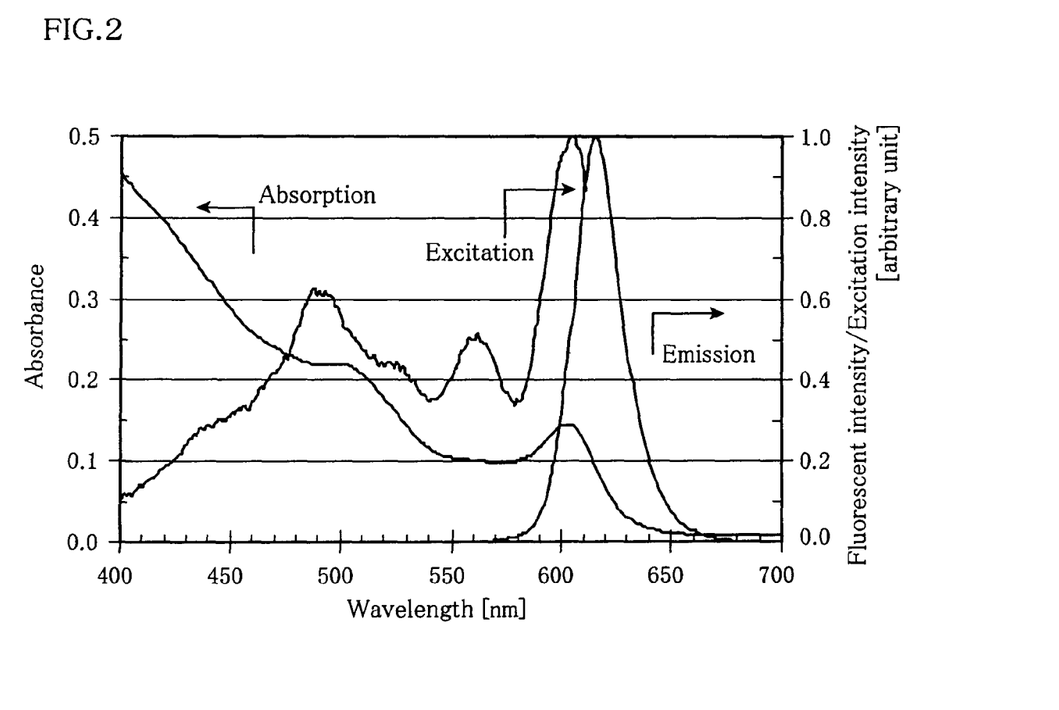
FIG. 2 is a view showing absorption, emission, and excitation spectra of a fluorescence conversion medium obtained by dispersing CdSe/ZnS core/shell type fluorescent fine particles in a transparent resin.

FIG. 2 is a view showing absorption, emission, and excitation spectra of a fluorescence conversion medium (thickness: about 20 μm) obtained by dispersing CdSe/ZnS core/shell fluorescent fine particles (emission peak: 615 nm) in a transparent resin. The figure shows co-existence of a strong absorption and a strong excitation in the emission region.

Figure 3:
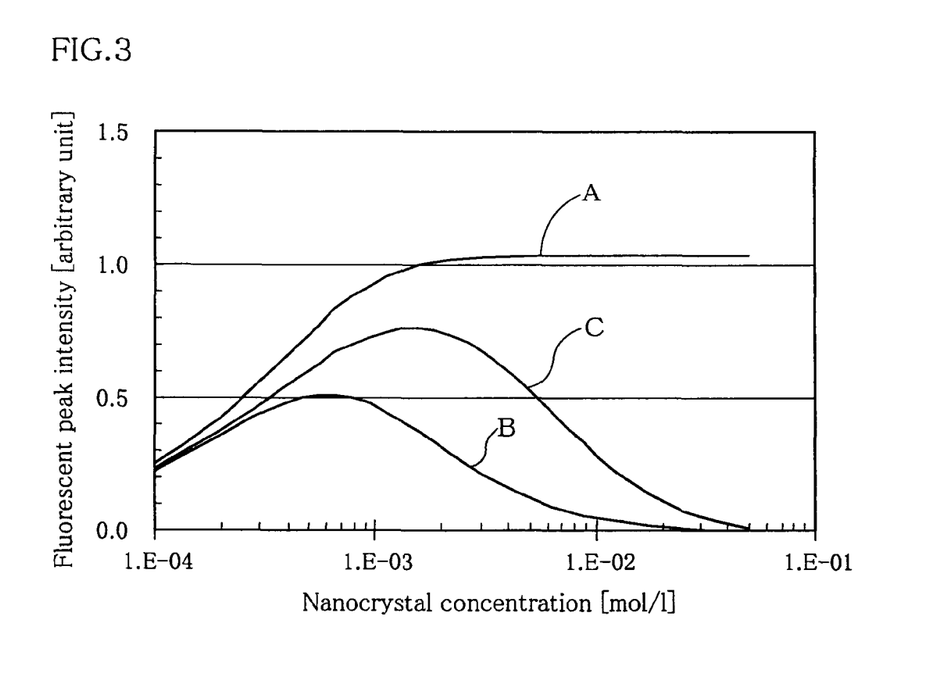
FIG. 3 is a view showing a relationship between the nanocrystal concentration and the fluorescent intensity of a fluorescence conversion medium obtained by dispersing CdSe/ZnS core/shell type fluorescent fine particles in a transparent resin.

FIG. 3 is a view showing a relationship between the concentration of a nanocrystal and the fluorescent peak intensity.

A blue electroluminescence (EL) device having a peak wavelength at 465 nm was assumed to be a light source part. A low pass color filter for red having a transmitting band of 580 nm or more (transmits light of a long wavelength, i.e., transmits light with a low frequency) was assumed to be a color filter to be stacked thereon. For the fluorescent fine particles, the absorption data shown in FIG. 2 was used. The fluorescent peak intensity was calculated while varying the concentration of the fluorescent fine particles, providing that the fluorescent quantum efficiency is 0.8 and the thickness of the fluorescence conversion medium is 10 μm.

The outline of the calculation is described. Of photons emitted from the light source part, the number of photons absorbed (primary absorption) by the fluorescence conversion medium is obtained from the absorption data of the fluorescence conversion medium. The photons are emitted (primary emission) according to the above-mentioned fluorescent quantum efficiency. Of the primarily-emitted photons, the amount ratio of the photons which are self-absorbed (secondary absorption) is obtained from the absorption data of the fluorescence conversion medium in the emission region. Assuming that the self-absorbed photons are re-emitted (secondary emission) in a longer wavelength region in the above-mentioned quantum efficiency, the contribution of the secondarily-emitted photons was obtained. An emission spectrum was obtained considering the above-mentioned primary and secondary absorptions, the primary and secondary emissions, and the amount of transmitted light obtained by considering these.

The abscissa indicates the concentration of a nanocrystal in a transparent medium and the ordinate indicates the fluorescent peak intensity. In the figure, A shows the dependency of the fluorescent peak intensity on the concentration of the fluorescent fine particles obtained on the assumption that self-absorption does not occur and all of the emitted fluorescence can be outcoupled. At a high concentration, the fluorescent intensity no longer increases due to saturated absorption amount. B shows the case where only self absorption is considered. It is seen that, as the concentration increases, fluorescence inside cannot be outcoupled since self absorption becomes dominant. C shows the case where self absorption and re-emission are considered. It is seen that a significant amount of self-absorbed components can be outcoupled as re-emitted light.

Figure 4:
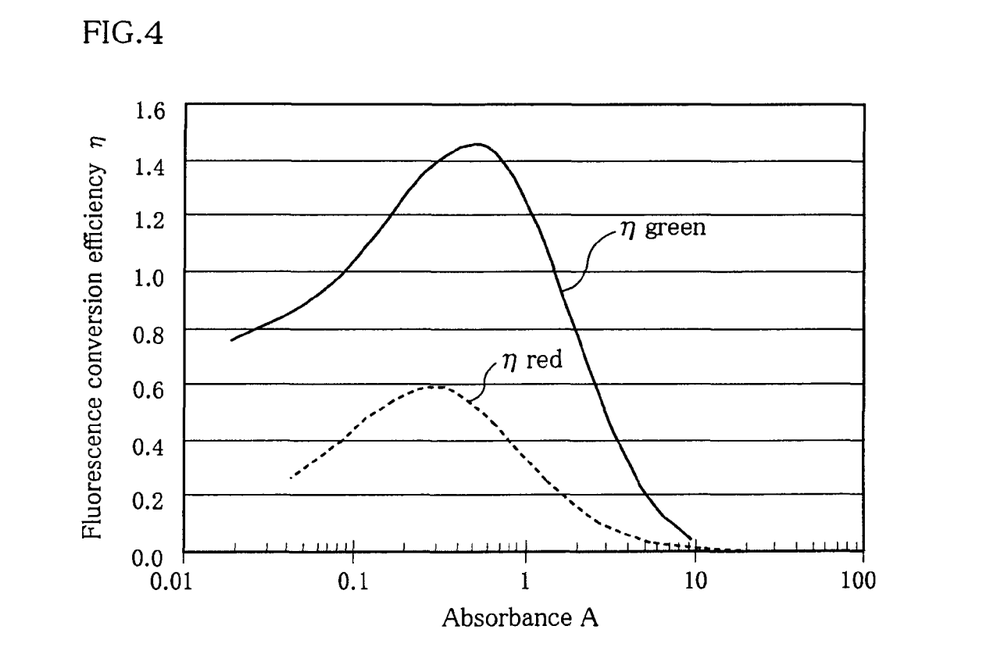
FIG. 4 is a view showing a relationship between the absorbance and the fluorescence conversion efficiency of red fluorescence and green fluorescence of a fluorescence conversion medium obtained by dispersing CdSe/ZnS core/shell type fluorescent fine particles in a transparent resin.

FIG. 4 is a view showing a relationship between the absorbance A ($=\log_{10} I_0/I$, $I_0$: intensity of light entering into the fluorescence conversion medium, I: intensity of light emitted from the fluorescence conversion medium) and the fluorescence conversion efficiency η at a wavelength where the emission intensity of the fluorescence conversion medium becomes maximum. Here, the fluorescence conversion efficiency η is the ratio of the luminance of light entered from the light source part (organic EL device) and the luminance of light outcoupled through the fluorescence conversion medium and the color filter. For red, the calculation was carried out using data on a CdSe/ZnS core/shell semiconductor nanocrystal with an emission peak wavelength of 615 nm and data on a low pass color filter for red of which the cutoff wavelength is 580 nm. For green, the calculation was carried out using data on a CdSe/ZnS core/shell semiconductor nanocrystal with an emission peak wavelength of 525 nm and data on a bandpass color filter for green with a transmission band of 480 to 590 nm. It is understood that, although a slight difference was observed between red and green, high conversion efficiency can be obtained in a range of $0.1 \leq A \leq 1.0$. It is seen that $0.1 \leq A \leq 0.7$ is particularly preferred for red, and $0.2 \leq A \leq 1.0$ is particularly preferred for green.

To allow self absorption and re-emission to function effectively, the primary emission and the secondary absorption are required to be close in a wavelength region. Therefore, the value of overlapping of the emission spectrum $I(\lambda)$ and the absorbance spectrum $A(\lambda)$ (here, λ is a wavelength of light measured in the unit of nm) was defined as $P=\int A(\lambda) \cdot I(\lambda) d\lambda$ to obtain a preferable range.

The secondary emission as referred to herein is caused by re-absorption of the primarily-emitted light and re-emission. Therefore, it is of importance that the wavelength region of the primarily-emitted light and the intensity thereof I, and the wavelength region of the re-absorbed light and the intensity thereof A are overlapped. To evaluate quantitatively the degree of overlapping, the product of $I(\lambda)$ and $A(\lambda)$ is integrated by a wavelength λ. As a result, the contribution of overlapping is obtained.

Figure 5:
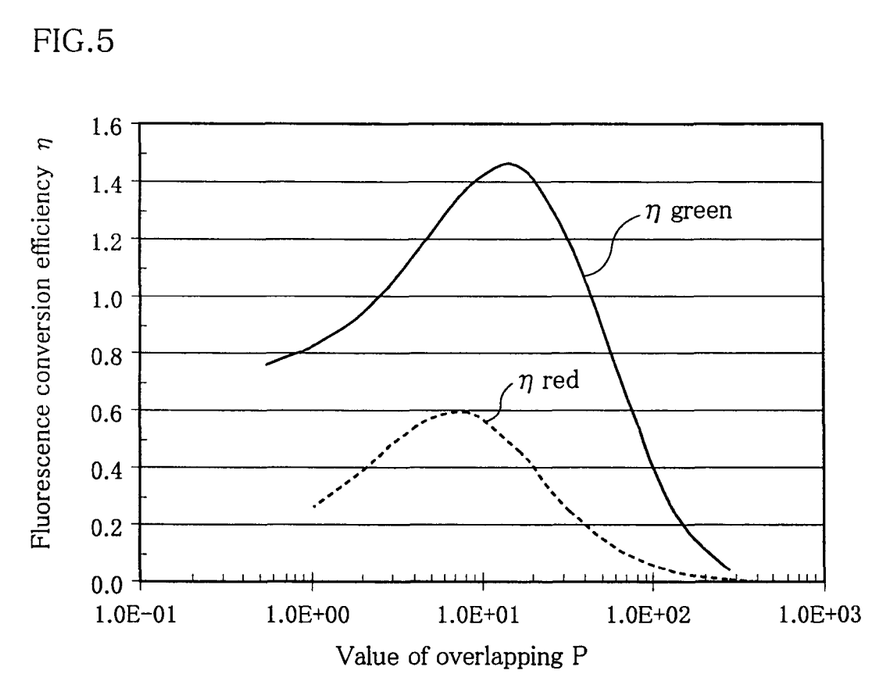
FIG. 5 is a view showing a relationship between the overlapping value and the fluorescence conversion efficiency of red fluorescence and green fluorescence of a fluorescence conversion medium obtained by dispersing CdSe/ZnS core/shell type fluorescent fine particles in a transparent resin.

The results are shown in FIG. 5. Although the optimum range is slightly different between red and green, it is preferred that p be $2.5 \leq P \leq 30$. It is seen that $2.5 \leq P \leq 20$ is more preferable for red, and $4 \leq P \leq 30$ is more preferable for green.

As mentioned above, in the fluorescence conversion medium using a fluorescent fine particle formed of an inorganic nanocrystal, the effect of self-absorption and re-emission can be fully utilized to maximize conversion efficiency by optimizing the intensity of an absorption in the emission region.

Figure 6:
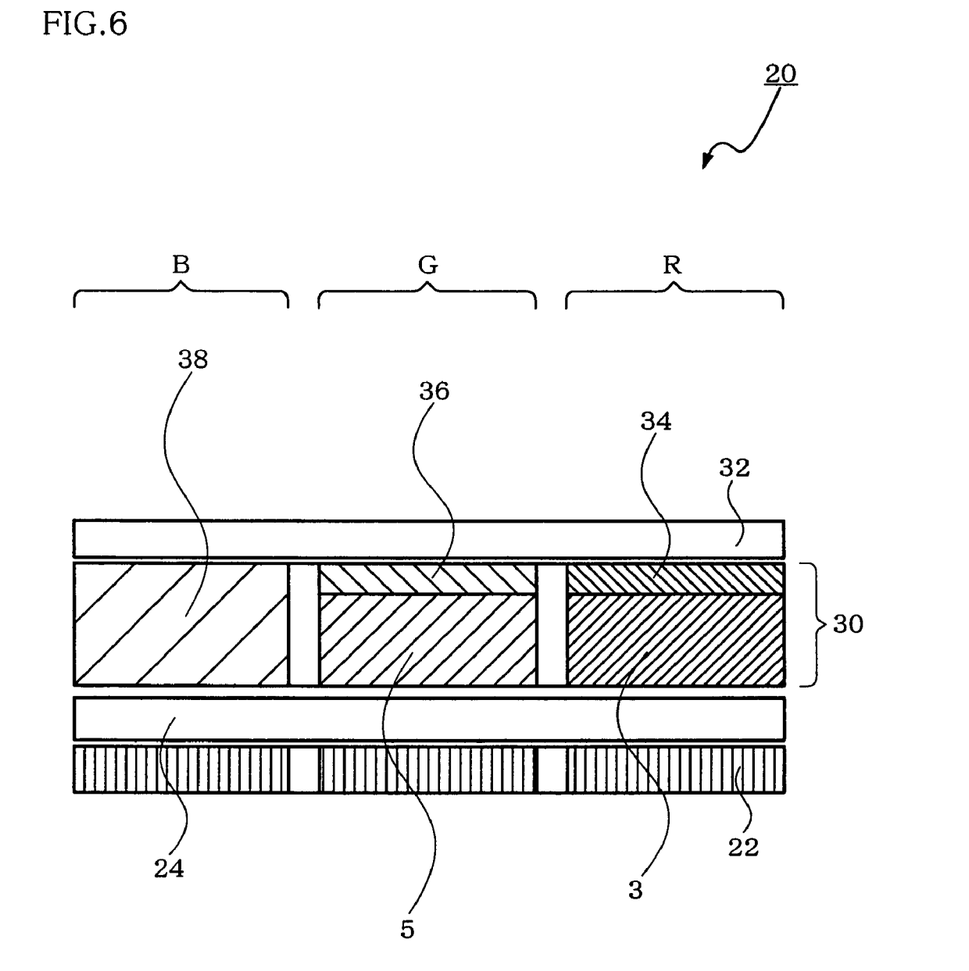
FIG. 6 is a schematic cross-sectional view showing one embodiment of the color emitting apparatus according to the invention.

FIG. 6 is a schematic cross-sectional view showing one embodiment of the color emitting apparatus according to the invention.

A color emitting apparatus 20 is provided with a light source part 22 which emits visible and/or near ultraviolet light, and a color conversion part 30 which receives light from the light source part 22 and emits visible fluorescence. The color conversion part 30 is formed on a substrate 32. A transparent medium 24 is interposed between the light source part 22 and the color conversion part 30.

In this embodiment, the light source part 22 emits at least blue light. The color conversion part 30 is formed of a blue color conversion part, a green color conversion part, and a red color conversion part. The blue color conversion part is formed of a blue color filter 38 which transmits, of the light from the light source part 22, light in the blue wavelength region, and blocks light components in the other wavelength regions.

The green color conversion part is formed of the abovementioned green fluorescence conversion medium 5 of the invention and a green color filter 36. The green color filter 36 transmits fluorescence emitted by the green fluorescent medium 5 and/or, of light transmitting the green color fluorescence conversion medium 5, light in a specific green wavelength region, and blocks light components in the other wavelength regions.

The red color conversion part is formed of the abovementioned red fluorescence conversion medium 3 of the invention and a red color filter 34. The red color filter 34 transmits fluorescence emitted by the red fluorescent medium 3 and/or, of light transmitting the red fluorescence conversion medium 3, light in a specific red wavelength region, and blocks light components in the other wavelength regions.

The light source part 22 and the red conversion part form a red pixel R. Similarly, the light source part 22 and the green conversion part form a green pixel G, and the light source part 22 and the blue conversion part form a blue pixel B.

In this embodiment, the green fluorescence conversion medium 5 of the green pixel G and the red fluorescence conversion medium 3 of the red pixel emits green light and red light, respectively, upon receipt of light from the light source part 22 which emits light containing at least blue color components (wavelength: 430 to 490 nm), whereby color display is realized.

The blue pixel B does not have a fluorescence conversion medium, and only has the color filter 38. Blue color emission is attained by allowing only blue color components to transmit, of the light from the light source part 22. As a result, emission of the three primary colors required for full color display is attained. In the present embodiment, formation of a blue fluorescence conversion medium is not required, which leads to simplification of the production process of an emitting apparatus.

Each of these color conversion parts may be formed of a fluorescence conversion medium alone, a color filter alone, a stacked body of a fluorescence conversion medium and a color filter, or an arbitrary combination of these.

The structures of the color emitting apparatus are described below.

2. Color Emitting Apparatus (1) Light Source Part

As the light source part, a light source which emits visible light can be used. For example, an organic EL device, an inorganic EL device, a semiconductor LED, a fluorescent display tube or the like can be used. Of them, it is preferred to use an EL device in which a transparent electrode is used on the outcoupling side, for example, an organic EL device and an inorganic EL device each formed of a light reflective electrode, an emitting layer, and a transparent electrode opposing to the light reflective electrode and being disposed such that the emitting layer is interposed between the light reflective electrode and the transparent electrode. In particular, an organic EL device and an inorganic EL device which can display an arbitrary image of high quality in a large volume by a simple matrix configuration or by pixel addressing using an active matrix driving are preferable.

A case where an organic EL device using a transparent electrode disposed on the outcoupling side is used as the light source part is described below.

Figure 7:
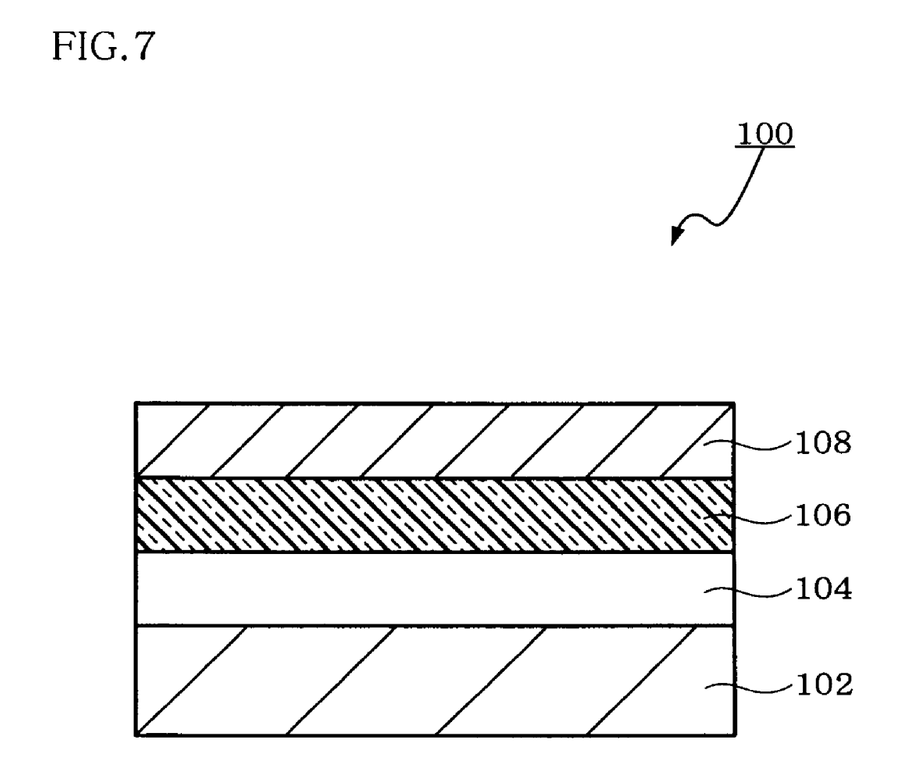
FIG. 7 is a schematic cross-sectional view showing one embodiment of the organic electroluminescence device according to the invention.

FIG. 7 is a cross-sectional view showing an example of the structure of the organic EL device.

The organic EL device 100 has a configuration in which a light reflective electrode 104, a luminescent medium 106, and a transparent electrode 108 are stacked on a substrate 102 in this order.

The organic EL device 100 emits light by supplying electrons and holes to the luminescent medium 106 and allowing the electrons and the holes to be recombined by applying a voltage between the light reflective electrode 104 and the transparent electrode 108. Light generated in the luminescent medium 106 is outcoupled from the transparent electrode 108. Due to the formation of the light reflective electrode 104, light traveling in the direction of the substrate can be efficiently outcoupled.

The organic EL device shown in FIG. 7 is of top-emission type. The organic EL device may be of bottom-emission type in which the light reflective electrode 104 is a transparent electrode, the transparent electrode 108 is a light reflective electrode, and the substrate 102 is a light transmissible substrate.

(A) Substrate

The substrate of the organic EL device is a member for supporting the organic EL device and the like. It is preferable that the substrate exhibit excellent mechanical strength and dimensional stability.

As examples of the material for the substrate, a glass plate, a metal plate, a ceramic plate, a plastic plate (e.g. polycarbonate resin, acrylic resin, vinyl chloride resin, polyethylene terephthalate resin, polyimide resin, polyester resin, epoxy resin, phenol resin, silicon resin, fluororesin, and polyethersulfone resin), and the like can be given.

(B) Light Reflective Electrode (First Electrode)

The first electrode is a light reflective electrode having light reflectivity and is not required to have transparency. In the invention, the device may have a configuration in which the light reflective electrode is anode, and the transparent electrode is cathode (described later), or a configuration in which the light reflective electrode is cathode and the transparent electrode is anode.

When the first electrode is used as the anode, a metal satisfying a work function required for holes injection is used. It is preferred that the work function be 4.6 eV or more. Specific examples include metals such as gold, silver, copper, iridium, molybdenum, niobium, nickel, osmium, palladium, platinum, ruthenium, tantalum, tungsten, aluminum or alloys thereof, metal oxides such as oxides of indium and/or tin (hereinafter abbreviated as "ITO"), a conductive polymer such as cupper iodide, polypyrrole, polyanilline, and poly(3-methylthiophene), and a stacked body thereof.

For the cathode, a metal, an alloy or an electroconductive compound, or a mixture thereof which has a small work function (4 eV or less) can be used. Specific examples of the electrode substance include one or more of sodium, sodium-potassium alloy, magnesium, lithium, magnesium/silver alloy, aluminum/aluminum oxide, aluminum/lithium alloy, indium, and rare earth metals.

(C) Luminescent Medium

The luminescent medium can be defined as a medium including an organic emitting layer which can emit light by electroluminescence upon recombination of electrons and holes.

The luminescent medium can be configured by stacking the following layers on the anode.

(i) Organic emitting layer
(ii) Hole injecting layer/organic emitting layer
(iii) Organic emitting layer/electron injecting layer
(iv) Hole injecting layer/organic emitting layer/electron injecting layer
(v) Organic semiconductor layer/organic emitting layer
(vi) Organic semiconductor layer/electron barrier layer/organic emitting layer
(vii) Hole injecting layer/organic emitting layer/

Of these, the configuration (iv) is preferably used due to higher luminance and excellent durability.

As examples of the emitting material for the organic emitting layer of the luminescent medium, a single material or a combination of two or more of a p-quarterphenyl derivative, a p-quinquephenyl derivative, a benzodiazole compound, a benzimidazole compound, a benzoxazole compound, a metal-chelated oxynoid compound, an oxadiazole compound, a styrylbenzene compound, a distyrylpyrazine derivative, a butadiene compound, a naphthalimide compound, a perylene derivative, an aldazine derivative, a pyraziline derivative, a cyclopentadiene derivative, a pyrrolopyrrole derivative, a styrylamine derivative, a coumarin compound, an aromatic dimethylidyne compound, a metal complex having an 8-quinolinol derivative as the ligand, a polyphenyl compound, and the like can be given.

Of these organic emitting materials, 4,4'-bis(2,2-di-t-butylphenylvinyl)biphenyl (hereinafter abbreviated as "DTB-PBBi") and 4,4'-bis(2,2-diphenylvinyl)biphenyl (hereinafter abbreviated as "DPVBi") as the aromatic dimethylidyne compounds and derivatives thereof are more preferable.

A material obtained by doping an organic emitting material having a distyrylarylene skeleton or the like (host material) with a fluorescent dye which emits strong blue to red light (e.g. coumarin material) or a fluorescent dye similar to the host (dopant) may also be suitably used in combination. In more detail, it is preferable to use DPVBi or the like as the host material and N,N-diphenylaminobenzene (hereinafter abbreviated as "DPAVB") or the like as the dopant.

It is preferable to use a compound having a hole mobility measured when applying a voltage of $1 \times 10^4$ to $1 \times 10^6$ V/cm of $1 \times 10^{-6}$ cm$^2$/V·sec or more and an ionization energy of 5.5 eV or less for the hole injecting layer of the luminescent medium. Holes are reliably injected into the organic emitting layer by providing such a hole injecting layer, whereby a high luminance is obtained, or the device can be driven at a low voltage.

As specific examples of the material for the hole injecting layer, organic compounds such as a porphyrin compound, an aromatic tertiary amine compound, a styrylamine compound, an aromatic dimethylidyne compound, and a condensed aromatic ring compound, such as 4,4'-bis[N-(1-naphthyl)-N-phenylamino]biphenyl (hereinafter abbreviated as "NPD") and 4,4',4"-tris[N-(3-methylphenyl)-N-phenylamino]triphenylamine (hereinafter abbreviated as "MTDATA") can be given.

It is also preferable to use an inorganic compound such as p-type Si or p-type SiC as the material for the hole injecting layer. It is also preferable to provide an organic semiconductor layer with a conductivity of $1 \times 10^{-10}$ S/cm or more between the hole injecting layer and the anode layer or between the hole injecting layer and the organic emitting layer. Holes are more reliably injected into the organic emitting layer by providing such an organic semiconductor layer.

It is preferable to use a compound having a hole mobility measured when applying a voltage of $1 \times 10^4$ to $1 \times 10^6$ V/cm of $1 \times 10^{-6}$ cm$^2$/V·sec or more and an ionization energy exceeding 5.5 eV for the hole injecting layer of the luminescent medium. Holes are reliably injected into the organic emitting layer by providing such a hole injecting layer, whereby a high luminance is obtained, or the device can be driven at a low voltage. As specific examples of the material for the electron injecting layer, a metal complex (Al chelate: Alq) of 8-hydroxyquinoline or its derivative or an oxadiazole derivative can be given.

An adhesion improving layer in the luminescent medium can be regarded as one form of the electron injecting layer. Specifically, the adhesion improving layer is an electron injecting layer formed of a material exhibiting excellent adhesion to the cathode, and is preferably formed of a metal complex of 8-hydroxyquinoline, its derivative, or the like. It is also preferable to provide an organic semiconductor layer with a conductivity of $1 \times 10^{-10}$ S/cm or more adjacent to the electron injecting layer. Holes are more reliably injected into the organic emitting layer by providing such an organic semiconductor layer.

The thickness of the luminescent medium can be set within a range of 5 nm to 5 μm. If the thickness of the luminescent medium is less than 5 nm, luminance and durability may be decreased. If the thickness of the luminescent medium exceeds 5 μm, a high voltage must be applied to the device. The thickness of the organic emitting layer is more preferably 10 nm to 3 μm, and still more preferably 20 nm to 1 μm.

(D) Transparent Electrode (Second Electrode)

As the second electrode, a transparent electrode material formed of a transparent conductive material is used. To ensure efficient outcoupling of light emitted from the organic emitting layer, the transparent electrode is formed of a material with a light transmittance of 10% or more, preferably 60% or more. As specific examples of the material for the anode layer, a single material or a combination of two or more of indium tin oxide (ITO), indium zinc oxide (IZO), copper indium (CuIn), tin oxide ($SnO_2$), zinc oxide (ZnO), antimony oxide ($Sb_2O_3$, $Sb_2O_4$, $Sb_2O_5$), aluminum oxide ($Al_2O_3$), and the like can be given. To lower resistance within a range which does not impair the transparency of the transparent electrode, it is preferable to add one or a combination of two or more of a metal such as Pt, Au, Ni, Mo, W, Cr, Ta and Al.

When the second electrode is used as the cathode, a low work function layer formed of a material with a low work function for injecting electrons to the organic emitting layer may be used in combination. As the low work function layer, a component material having a low work function is used to facilitate electron injection. For example, a component material with a work function of less than 4.0 eV is used. It is preferred that the low work function layer be formed on the luminescent medium after processing to be thin enough to exhibit a sufficient transmittance, following by stacking of the transparent electrode thereon. The reason for the above is that a transparent oxide conductive material such as ITO and ZnO has a work function of 4.6 eV or more, which is difficult to be used as the cathode.

As the material with a low work function, metals such as aluminum, barium, calcium, cerium, erbium, europium, gadolinium, hafnium, indium, lanthanum, magnesium, silver, manganese, neodium, scandium, samarium, yttrium, zinc, and zirconium, or alloy compounds of these metals with other metals can be used. Magnesium, silver, and an alloy of magnesium and silver are particularly preferable.

The film thickness of the transparent electrode is 5 to 1000 nm, preferably 10 to 500 nm. The thickness of the low work function layer is set within the range of 1 to 100 nm, preferably 5 to 50 nm, and more preferably 5 to 30 nm. For each range, a film thickness exceeding the upper limit is not preferable in respect of efficient outcoupling of light emitted from the organic emitting layer. A film thickness below the lower limit is not preferable in respect of suppressing damage to the organic emitting layer when forming the transparent electrode layer.

Each layer of the organic EL device can be formed by a known method, such as vacuum deposition, sputtering, and spin coating.

The above-mentioned organic EL device may include a transparent medium (described later) connecting the transparent electrode and the fluorescence conversion medium, if necessary. The transparent medium is used to increase the smoothness of the surface of the fluorescence conversion medium.

(2) Transparent Medium

As the transparent medium, an inorganic material, an organic material, and a stacked body thereof may be used appropriately insofar as the material is transparent with a transmittance of visible light of 50% or more.

The inorganic material may preferably be an inorganic oxide layer, an inorganic nitride layer, and an inorganic oxynitride layer. For example, silica, alumina, AlON, SiAlON, $SiN_x$ ($1 \leq x \leq 2$), $SiO_xN_y$ (preferably, $0.1 \leq x \leq 1$, $0.1 \leq y \leq 1$) or the like can be given.

As the organic material, silicone gel, a fluorohydrocarbon liquid, an acrylic resin, an epoxy resin, silicone resin or the like may be used.

The transparent medium may be formed by sputtering, CVD, sol-gel, or the like in the case of an inorganic material. In the case of an organic material, the transparent medium may be formed by spin coating, printing, drip injection or the like.

The layer thickness of the transparent medium is 0.01 μm to 10 mm, preferably 0.1 μm to 1 mm.

(3) Color Filter

In addition, the color filter prevents a decrease in contrast ratio of the emitting apparatus, which decrease is caused when the fluorescence conversion medium emits fluorescence by receiving light from the outside, e.g., sunlight and room lighting or when incident light is reflected on a reflective electrode to the outside. The contrast ratio is a brightness ratio of the emitting state to the non-emitting state of the apparatus.

Examples of materials for the color filter used in the invention include dyes only or solid objects in which a dye is dissolved or dispersed in a binder resin.

Red dye (R): perylene pigment, lake pigment, azo pigment and the like

Green dye (G): halogen-multisubstituted phthalocyanine pigment, halogen-multisubstituted copper phthalocyanine pigment, basic triphenylmethane dye and the like Blue dye (B): copper phthalocyanine pigment, indanthrone pigment, indophenol pigment, cyanine pigment and the like.

As the binder resin, it is preferable to use a transparent material (having a transmittance of visible light of 50% or more). Examples of the binder resin include transparent resins (polymers) such as polymethyl methacrylate, polyacrylate, polycarbonate, polyvinyl alcohol, polyvinyl pyrrolidone, hydroxyethylcellulose, and carboxymethylcellulose, and photo-setting resist materials having reactive vinyl groups such as acrylic acid type, methacrylic acid type, and the like, as photosensitive resins to which photolithography can be applied. When using a printing method, a printing ink (medium) using a transparent resin such as a polyvinyl chloride resin, a melamine resin, and a phenol resin is selected.

When forming the color filter using a dye as the major component, the color filter may be formed by a vacuum deposition method or a sputtering method using a mask having a desired color filter pattern. When forming the color filter using a dye and a binder resin, the dye, the above-mentioned resin and a resist are mixed, dispersed, or dissolved, followed by application by spin coating, roll coating, casting, or the like. The resulting film is generally patterned into a desired color filter pattern by photolithography or printing. The thickness and the transmittance of each color filter are preferably set as follows.

R: Thickness 0.5 to 5.0 μm (transmittance 50% or more/ 610 nm),

G: Thickness 0.5 to 5.0 μm (transmittance 50% or more/ 545 nm),

B: Thickness 0.2 to 5.0 μm (transmittance 50% or more/ 460 nm).

(4) Substrate

The substrate used in the invention is a substrate for supporting the color display apparatus, and is preferably a flat and smooth substrate having a transmittance of 50% or more to light rays within visible ranges of 400 to 700 nm. Specific examples thereof include glass plates and polymer plates. Examples of the glass plate include soda-lime glass, barium/strontium-containing glass, lead glass, aluminosilicate glass, borosilicate glass, barium borosilicate glass, and quartz. Examples of the polymer plate include polycarbonate, acrylic polymer, polyethylene terephthalate, polyethersulfide, and polysulfone.

By combining the color emitting apparatus having the above configuration with a peripheral drive circuit and an interface circuit, a display module which is applicable to TVs for public use or the like can be realized readily.

Figure 8:
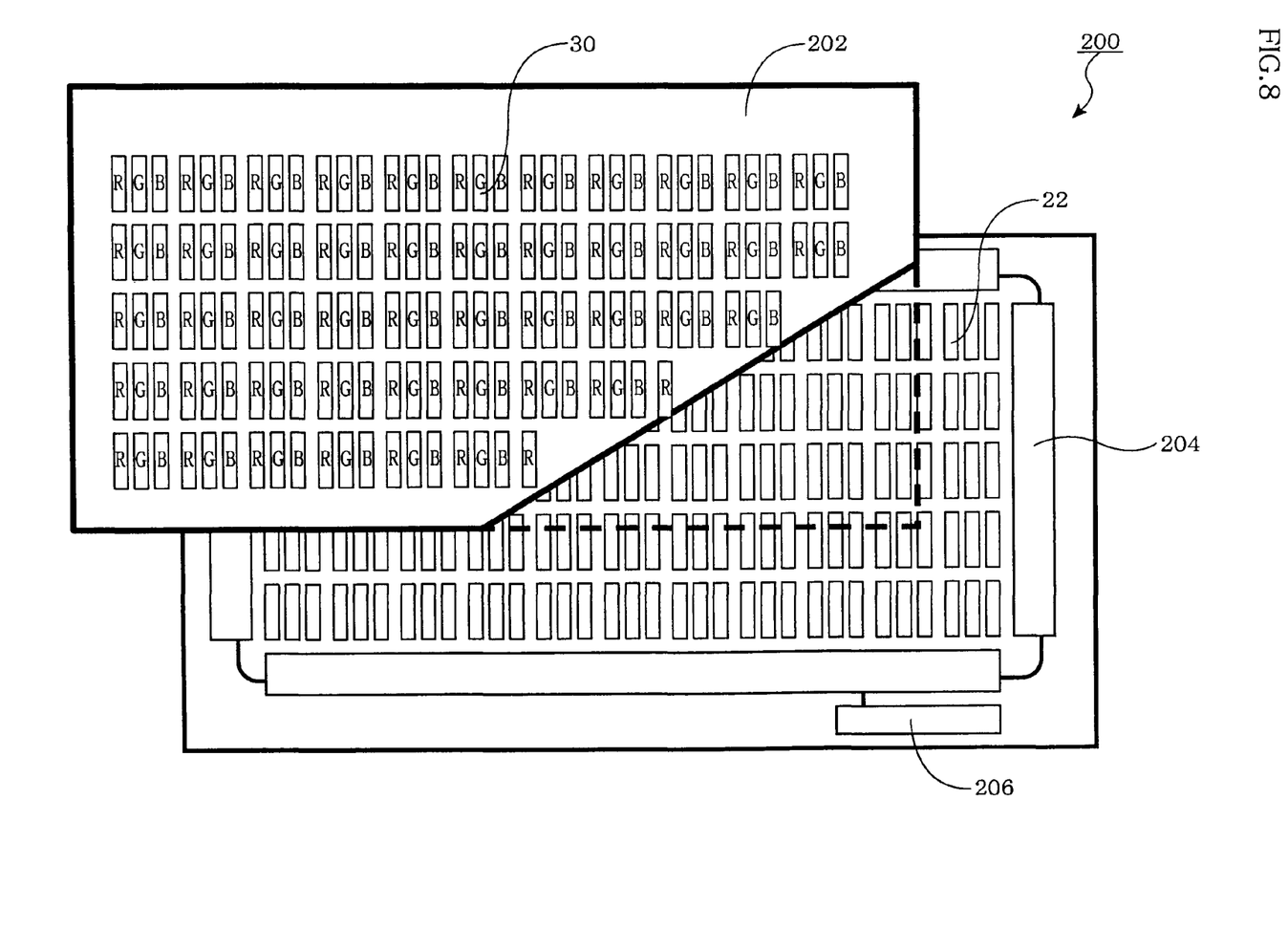
FIG. 8 is a schematic view of a display module using the color emitting apparatus according to the invention.

FIG. 8 is a schematic view of a display module using the color emitting apparatus according to the invention.

A display module 200 is obtained by laminating a substrate containing the color conversion part 30 (color conversion substrate 202), the light source part 22, and a substrate in which a peripheral drive circuit part 204, and an interface circuit part 206 are integrated. The light source part 22 is preferably an organic EL device, more preferably a monochromic organic EL device emitting blue color light.

The display module using the color emitting apparatus according to the invention is not limited to the above configuration.

EXAMPLES

Example 1

(1) Production of Light Source Part

On a glass substrate with a dimension of 25 mm×75 mm×1.1 mm, ITO was applied to have a thickness of 130 nm by sputtering to obtain a transparent supporting substrate. Subsequently, the substrate was subjected to ultrasonic washing for 5 minutes in isopropyl alcohol. Then, the substrate was dried by blowing nitrogen, followed by 10-minute washing with UV ozone (UV 300, manufactured by Samco International Co., Ltd).

The transparent substrate was secured to a substrate holder of a commercially available vacuum deposition apparatus (manufactured by ULVAC, Inc). 200 mg of N,N'-bis(3-methylphenyl)-N,N'-diphenyl(1,1'-biphenyl)-4,4'-diamine (TPD) was put in a molybdenum resistant heating boat. 200 mg of 4,4'-bis(2,2'-diphenylvinyl)biphenyl (DPVBi) was put in another molybdenum resistant heating boat, and 200 mg of 4,4'-bis(2,4-N,N-diphenylaminophenylvinyl)biphenyl (DPAVBi) was put in still another molybdenum resistant boat. The pressure of the vacuum chamber was decreased to $1\times10^{-4}$ Pa.

Subsequently, the boat containing TPD was heated to 215 to 220° C., and deposited on the transparent substrate at a vacuum deposition rate of 0.1 to 0.3 nm/sec to form a hole-injection layer with a thickness of 60 nm. The temperature of the substrate was a room temperature. Without removing the substrate from the vacuum chamber, DPVBi as the host material was stacked to have a thickness of 40 nm on the hole-injection layer. Simultaneously, the boat containing DPAVBi was heated, and DPAVBi as the emitting dopant was mixed with the emitting layer. The deposition rate of DPVBi as the host material was 2.8 to 3.0 nm/sec, while the deposition rate of DPAVBi as the dopant material was 0.1 to 0.13 nm/sec. Then, the pressure of the vacuum chamber was returned to atmospheric pressure. An 8-hydroxyquinoline/aluminum complex as a material for an adhesive layer was placed in a molybdenum resistant heating boat. Aluminum as a cathode material was fitted to a tungsten filament, and the pressure of the vacuum chamber was decreased to $1\times10^{-4}$ Pa.

Subsequently, the 8-hydroxyquinoline/aluminum complex was deposited at a deposition rate of 0.01 to 0.03 nm/sec to form an adhesive layer with a thickness of 20 nm. Further, silver was deposited to have a thickness of 150 nm to obtain a cathode.

Thus, the light source formed of an organic EL device was obtained. A voltage of 7 V was applied to the resultant light source. As a result of the measurement performed near the transparent supporting substrate using a spectroradiometer, it was found that the device emitted bluish green light with a luminance of 230 nits and a chromaticity coordinate (hereinafter abbreviated as "CIE coordinate") of (0.16, 0.30). An emission peak wavelength was 470 nm.

(2) Production of Fluorescence Conversion Medium (I) Fluorescent Fine Particles

As the fluorescent fine particles, four types of a core/shell semiconductor nanocrystal shown in Table 1 were prepared.

TABLE 1

| | Core material | Core particle size (nm) | Shell material | Emission peak wavelength (nm) |
|---|---|---|---|---|
| NC1 | CdSe | 5.2 | ZnS | 615 |
| NC2 | CdSe | 4.0 | ZnS | 531 |
| NC3 | InP | 4.9 | ZnS | 616 |
| NC4 | ZnTe | 6.8 | ZnS | 529 |

(II) Transparent Medium Solution for Dispersing and Retaining Fluorescent Fine Particles As the transparent medium, a copolymer of methacrylic acid and methyl methacrylate (copolymerization ratio of methacrylic acid=15 to 20%, Mw=20,000 to 25,000, refractive index=1.60) was used. The copolymer was dissolved in 1-methoxy-2-acetoxypropane.

(III) Preparation of Color Filter

A pigment-based red color filter material (CRY-S840B, manufactured by Fujifilm Arch Co., Ltd.) was applied onto a 0.7 mm-thick glass plate by spin coating, and baked at 200° C. after exposure to UV rays. As a result, a substrate for a red color filter (thickness: 1.2 μm) was obtained.

Similarly, a pigment-based green color filter material (CG-8510L, manufactured by Fujifilm Arch Co., Ltd.) was applied onto a 0.7 mm-thick glass plate by spin coating, and baked at 200° C. after exposure to UV rays. As a result, a substrate for a green color filter (thickness: 1.0 μm) was obtained.

The transmission spectrum of each color filter was measured by Shimadzu UV-VIS-NIR Spectrometer UV-3100S (manufactured by Shimadzu Corporation). It was found that the transmittance of the red color filter was 91% (a value at a wavelength of 615 nm) and the transmittance of the green color filter was 88% (a value at a wavelength of 525 nm).

(IV) Preparation and Evaluation of Fluorescence Conversion Substrate

NC1 fine particles emitting red fluorescence with a fluorescent wavelength of 615 nm were added to a transparent medium solution such that the nanocrystal concentration of the film became $7.8\times10^{-4}$ mol/L, and the particles were allowed to disperse. The resultant dispersion was applied onto a glass substrate by spin coating, followed by drying at 200° C. for 30 minutes. As a result, a 10 µm-thick fluorescence conversion substrate formed singly of a fluorescence conversion medium was obtained. The absorbance spectrum and the emission spectrum of the resultant substrate were measured using Shimadzu UV-VIS-NIR Spectrometer UV-3100S (manufactured by Shimadzu Corporation) and Hitachi Fluorescent Spectrometer F4500 (manufactured by Hitachi Ltd.), respectively. Using the results of the measurement, the absorbance of the fluorescence conversion medium (A) at an emission peak wavelength (615 nm) of 0.17 and the value of overlapping (P) of emission and absorption of 4.1 were obtained.

Under the same conditions, a fluorescence conversion medium was formed by spin coating on the above-obtained color filter film of the red color filter substrate which had been prepared above, and dried at 200° C. for 30 minutes. As a result, a fluorescence conversion substrate formed of a stacked body of the red color filter and the fluorescence conversion medium was obtained. The thickness of the fluorescence conversion medium was 10 µm.

The substrate was attached, through a silicone oil with a refractive index of 1.53, to the organic EL light source such that the fluorescence conversion medium and the transparent supporting substrate of the organic EL light source which had been prepared above were opposed. A voltage was applied to the organic light source part. As a result of a measurement performed using a spectroradiometer, it was found that good red color emission with an emission peak wavelength of 621 nm, a fluorescence conversion efficiency of 0.54, and a CIE coordinate of (0.67, 0.32) was obtained.

Comparative Example 1

The same procedures as in Example 1 were followed, except that the NC1 (nanocrystal) concentration of the film was changed to $6.3\times10^{-3}$ mol/L. The absorbance (A) of the fluorescence conversion medium at an emission peak wavelength (615 nm) was 1.34 and the value of overlapping (P) of emission and absorption was 33.1. As a result of the evaluation performed when combined with the light source part, it was found that the emission peak wavelength was 632 nm and the conversion efficiency was lowered to 0.25. The CIE coordinate was (0.70, 0.30), which was excessive for red.

Comparative Example 2

The same procedures as in Example 1 were followed, except that the NC1 (nanocrystal) concentration of the film was changed to $2.0\times10^{-4}$ mol/L and the film thickness was changed to 20 µm. The absorbance (A) of the fluorescence conversion medium at an emission peak wavelength (615 nm) was 0.08 and the value of overlapping (P) of emission and absorption was 1.8. As a result of the evaluation performed when combined with the fluorescence conversion medium and the light source part, it was found that the emission peak wavelength was 618 nm and the conversion efficiency was lowered to 0.27. The CIE coordinate was (0.64, 0.34), which was not sufficient for red.

Example 2

The same procedures as in Example 1 were followed, except that NC2 fine particles emitting green fluorescence were used instead of NC1 and the nanocrystal concentration of the film was changed to $8.5\times10^{-3}$ mol/L and the film thickness was changed to 20 µm. The absorbance (A) of the fluorescence conversion medium at an emission peak wavelength (525 nm) was 0.81 and the value of overlapping (P) of emission and absorption was 23.6. As a result of the evaluation performed when combined with the light source part and the green color filter, it was found that the emission peak wavelength was 540 nm and the conversion efficiency reached 1.36. The CIE coordinate was (0.22, 0.72), which was satisfactory.

Comparative Example 3

The same procedures as in Example 2 were followed, except that the NC2 (nanocrystal) concentration of the film was changed to $1.6\times10^{-3}$ mol/L and the film thickness was changed to 10 µm. The absorbance (A) of the fluorescence conversion medium at an emission peak wavelength (525 nm) was 0.07 and the value of overlapping (P) of emission and absorption (P) was 2.2. As a result of the evaluation performed when combined with the light source part and the green color filter, it was found that the conversion efficiency was lowered to 0.96. The CIE coordinate was (0.14, 0.52), which was excessive for green.

Example 3

The same procedures as in Example 1 were followed, except that NC3 fine particles emitting red fluorescence were used instead of NC1 and the nanocrystal concentration of the film was changed to $7.0\times10^{-4}$ mol/L and the film thickness was changed to 20 µm. The absorbance (A) of the fluorescence conversion medium at an emission peak wavelength (616 nm) was 0.19 and the value of overlapping (P) of emission and absorption of 5.3 were obtained. As a result of the evaluation performed when combined with the light source part and the red color filter, it was found that the emission peak wavelength was 622 nm and the conversion efficiency reached 0.55. The CIE coordinate was (0.66, 0.33), which was satisfactory.

Comparative Example 4

The same procedures as in Example 3 were followed, except that the nanocrystal concentration of the film was changed to $6.3\times10^{-3}$ mol/L and the film thickness was changed to 20 µm. The absorbance (A) of the fluorescence conversion medium at an emission peak wavelength (616 nm) was 1.18 and the value of overlapping (P) of emission and absorption was 33.3. As a result of the evaluation performed when combined with the light source part and the red color filter, it was found that the emission peak wavelength was 638 nm, the conversion efficiency was lowered to 0.28. The CIE coordinate was (0.70, 0.30), which was excessive for red.

Comparative Example 5

The same procedures as in Example 3 were followed, except that the nanocrystal concentration of the film was changed to $3.9\times10^{-4}$ mol/L and the film thickness was changed to 10 µm. The absorbance (A) of the fluorescence conversion medium at an emission peak wavelength (616 nm)

was 0.04 and the value of overlapping (P) of emission and absorption was 1.0. As a result of the evaluation performed when combined with the light source part and the red color filter, it was found that the emission peak wavelength was 617 nm, the conversion efficiency was lowered to 0.24. The CIE coordinate was (0.61, 0.35), which was insufficient for red.

Example 4

The same procedures as in Example 1 were followed, except that NC4 fine particles emitting green fluorescence were used instead of NC1 and the nanocrystal concentration of the film was changed to $7.0 \times 10^{-4}$ mol/L and the thickness was changed to 20 μm. The absorbance (A) of the fluorescence conversion medium at an emission peak wavelength (529 nm) was 0.22 and the value of overlapping (P) of emission and absorption was 5.5. As a result of the evaluation performed when combined with the light source part and the green color filter, it was found that an emission peak wavelength was 537 nm and the conversion efficiency reached 1.26. The CIE coordinate was (0.18, 0.60), which was satisfactory.

Comparative Example 6

The same procedures as in Example 4 were followed, except that the nanocrystal concentration of the film was changed to $3.0 \times 10^{-4}$ mol/L and the film thickness was changed to 20 μm. The absorbance (A) of the fluorescence conversion medium at an emission peak wavelength (529 nm) was 0.09 and the value of overlapping (P) of emission and absorption was 2.4. As a result of the evaluation performed when combined with the light source part and the green color filter, it was found that the emission peak wavelength was 489 nm, the conversion efficiency was lowered to 0.94. The CIE coordinate was (0.15, 0.52), which was insufficient for green.

Each parameter, the conversion efficiency, and the CIE coordinate of the fluorescence conversion media prepared in the examples and comparative examples are shown in Table 2.

INDUSTRIAL APPLICABILITY

The fluorescence conversion medium of the invention and the color emitting apparatus using the same can be used for display panels for a variety of display apparatuses such as TVs for public use, large-size displays, and display screens of portable phones.

What is claimed is:

1. A fluorescence conversion medium, comprising: core/shell fluorescent fine particles, which absorb visible light, near ultraviolet light, or both and emits visible fluorescence, and a transparent medium having the core/shell fluorescent fine particles dispersed therein, wherein said core/shell fluorescent fine particles are a material selected from the group consisting of CdSe/ZnS, InP/ZnS, and ZnTe/ZnS, said core/shell fluorescent fine particles are present in said transparent medium in a concentration of from $7.0 \times 10^{-4}$ mol·L$^{-1}$ to $85 \times 10^{-4}$ mol·L$^{-1}$, and said fluorescence conversion medium having an overlapping degree (P) represented by the following formula:

$$P = \int A(\lambda) \cdot I(\lambda) d\lambda$$

of $4.1 \leq P \leq 23.6$, wherein I(λ) (unit: nm$^{-1}$) indicates the emission intensity spectrum of the fluorescence conversion medium standardized to have a maximum value of 1 and A(λ) (unit: infinite) indicates an absorbance spectrum of the fluorescence conversion medium, providing that the wavelength of light is λ (unit: nm).

2. The fluorescence conversion medium according to claim 1, wherein the transparent medium is a resin and the surface of the core/shell fluorescent fine particles are subjected to a compatibilizing treatment to have an increased affinity with the resin.

3. A color emitting apparatus comprising,
a light source part which emits visible and/or near ultraviolet light, and
a color conversion part which absorbs and/or transmits light from the light source part and emits light having a spectrum differing from a spectrum of the light from the light source part,
the color conversion part containing the fluorescence conversion medium according to claim 1.

TABLE 2

| | Core material | Core particle size (nm) | Shell material | Nanocrystal concentration ($10^{-4}$ mol/l) | Thickness (μm) | Absorbance (−) | Value of overlapping (−) | Emission peak wavelength (−) | Conversion efficiency (−) | CIE CIE-x | CIE-y |
|---|---|---|---|---|---|---|---|---|---|---|---|
| Example 1 | CdSe | 5.2 | ZnS | 7.8 | 10 | 0.17 | 4.1 | 621 | 0.54 | 0.67 | 0.32 |
| Comparative Example 1 | CdSe | 5.2 | 2nS | 63 | 10 | 1.34 | 33.1 | 632 | 0.25 | 0.70 | 0.30 |
| Comparative Example 2 | CdSe | 5.2 | ZnS | 2.0 | 20 | 0.08 | 1.8 | 618 | 0.27 | 0.64 | 0.34 |
| Example 2 | CdSe | 4.0 | ZnS | 85 | 20 | 0.81 | 23.6 | 540 | 1.36 | 0.22 | 0.72 |
| Comparative Example 3 | CdSe | 4.0 | ZnS | 16 | 10 | 0.07 | 2.2 | 527 | 0.96 | 0.14 | 0.52 |
| Example 3 | InP | 4.9 | ZnS | 7.0 | 20 | 0.19 | 5.3 | 622 | 0.55 | 0.66 | 0.33 |
| Comparative Example 4 | InP | 4.9 | ZnS | 63 | 20 | 1.18 | 33.3 | 638 | 0.28 | 0.70 | 0.30 |
| Comparative Example 5 | InP | 4.9 | ZnS | 3.9 | 10 | 0.04 | 1.0 | 617 | 0.24 | 0.61 | 0.35 |
| Example 4 | ZnTe | 6.8 | ZnS | 7.0 | 20 | 0.22 | 5.5 | 537 | 1.26 | 0.18 | 0.60 |
| Comparative Example 6 | ZnTe | 6.8 | ZnS | 3.0 | 20 | 0.09 | 2.4 | 489 | 0.94 | 0.15 | 0.52 |

4. The color emitting apparatus according to claim 3, wherein the color conversion part is a stacked body comprising the fluorescence conversion medium and a color filter which transmits fluorescence emitted by the fluorescence conversion medium and/or, of light transmitting the fluorescence conversion medium, light in a specific wavelength region, and blocks light components in the other wavelength regions.

5. The color emitting apparatus according to claim 3, wherein the light source part emits light containing at least blue light, and the color conversion part receives light from the light source part to emit at least one of red, green, and blue lights.

6. A color emitting apparatus comprising,
a light source part which emits light containing at least blue light,
a blue conversion part which receives light from the light source part and emits blue light,
a green conversion part which receives light from the light source part and emits green light, and
a red conversion part which receives light from the light source part and emits red light,
the blue conversion part not containing the fluorescence conversion medium and containing a blue color filter which transmits light in a blue wavelength region and blocks light components in the other wavelength regions, of the light from the light source,
at least one of the green conversion part and the red conversion part being a stacked body of the fluorescence conversion medium according to claim 1 and a color filter which transmits fluorescence emitted by the fluorescence conversion medium and/or, of light transmitting the fluorescence conversion medium, light in a green or red wavelength region and blocks light components in the other wavelength regions.

7. The color emitting apparatus according to claim 3, wherein the light source is an organic electroluminescence device.

8. The color emitting apparatus according to 7, wherein the organic electroluminescence device comprises a first light reflective electrode, a second light transmissible electrode, and an organic luminescence medium containing an organic emitting layer formed between the first electrode and the second electrode.

9. The fluorescence conversion medium according to claim 1, wherein said core/shell fluorescent fine particles are CdSe/ZnS particles.

10. The fluorescence conversion medium according to claim 1, wherein said core/shell fluorescent fine particles are InP/ZnS particles.

11. The fluorescence conversion medium according to claim 1, wherein said core/shell fluorescent fine particles are ZnTe/ZnS particles.

* * * * *